(12) United States Patent
Song

(10) Patent No.: US 11,681,580 B2
(45) Date of Patent: Jun. 20, 2023

(54) SEMICONDUCTOR SYSTEM RELATED TO PERFORMING AN ERROR CORRECTION OPERATION USING AN ERROR CORRECTION METHOD

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/494,468

(22) Filed: Oct. 5, 2021

(65) Prior Publication Data

US 2022/0405166 A1    Dec. 22, 2022

(30) Foreign Application Priority Data

Jun. 16, 2021 (KR) .................. 10-2021-0078361

(51) Int. Cl.
| | | |
|---|---|---|
| *H03M 13/00* | (2006.01) | |
| *G06F 11/10* | (2006.01) | |
| *H03M 13/15* | (2006.01) | |

(52) U.S. Cl.
CPC ..... *G06F 11/1068* (2013.01); *H03M 13/1575* (2013.01)

(58) Field of Classification Search
CPC ................. H03M 13/1575; G06F 11/1068
See application file for complete search history.

(56) References Cited

U.S. PATENT DOCUMENTS

| | | | | |
|---|---|---|---|---|
| 7,242,615 B2* | 7/2007 | Nagashima | ............ | G11C 16/06 365/185.09 |
| 8,510,633 B2* | 8/2013 | Sakimura | ............ | G11C 13/0011 714/766 |
| 8,947,918 B2* | 2/2015 | Fujita | .................. | G11C 11/1653 365/158 |
| 9,348,697 B2* | 5/2016 | Hoya | .................. | G11B 20/1833 |
| 9,653,185 B2* | 5/2017 | Camp | ................. | G06F 11/1048 |
| 9,691,446 B2* | 6/2017 | Shimizu | ................... | G11C 7/22 |
| 9,767,920 B2* | 9/2017 | Kim | ..................... | G11C 29/4401 |
| 10,734,091 B2* | 8/2020 | Takahashi | ........... | G06F 11/1068 |
| 10,866,855 B2* | 12/2020 | Hong | .................. | G06F 13/1694 |

FOREIGN PATENT DOCUMENTS

KR       1020180019818 A       2/2018

* cited by examiner

*Primary Examiner* — Esaw T Abraham
(74) *Attorney, Agent, or Firm* — William Park & Associates Ltd.

(57) ABSTRACT

A semiconductor system includes a controller configured to, in a write operation, output write data and a write error code through at least any one of input/output lines, and in a read operation, receive read data and a read error code through at least any one of the input/output lines and detect a failure of the input/output lines depending on whether the read data is error-corrected; and a semiconductor device configured to, in the write operation, correct an error of the write data based on the write error code, store the error-corrected write data and store the write error code, and in the read operation, correct an error of the write data based on the write error code stored in the write operation, output the error-corrected write data as the read data, and output the write error code stored in the write operation, as the read error code.

27 Claims, 12 Drawing Sheets

SEMICONDUCTOR SYSTEM RELATED TO PERFORMING AN ERROR CORRECTION OPERATION USING AN ERROR CORRECTION METHOD

CROSS-REFERENCE TO RELATED APPLICATION

The present application claims priority under 35 U.S.C. § 119(a) to Korean application number 10-2021-0078361, filed in the Korean Intellectual Property Office on Jun. 16, 2021, the entire disclosure of which is incorporated herein by reference in its entirety.

BACKGROUND

1. Technical Field

Embodiments of the present disclosure may generally relate to a semiconductor system, and a semiconductor system related to performing an error correction operation of correcting an error included in data, by using an error correction method.

2. Related Art

Recently, in order to increase the operating speed of a semiconductor device, various schemes for inputting/outputting data including a plurality of bits per clock cycle have been used. In the case where an input/output speed of data is increased, the probability of an occurrence of an error during a data transmission process also increases. Therefore, a separate device and method for ensuring the reliability of data transmission are additionally demanded.

For example, there is used a method of generating error codes capable of checking the occurrence of an error and transmitting the error codes together with data, at each time when data is transmitted, thereby ensuring the reliability of data transmission. The error codes include an error detection code (EDC) capable of detecting an occurred error and an error correction code (ECC) capable of self-correcting an error upon occurrence of the error.

SUMMARY

In an embodiment, a semiconductor system may include: a controller configured to, in a write operation, output write data and a write error code through at least any one of a plurality of input/output lines, and in a read operation, receive read data and a read error code through at least any one of the plurality of input/output lines and detect a failure of the plurality of input/output lines depending on whether the read data is error-corrected; and a semiconductor device configured to, in the write operation, correct an error of the write data on the basis of the write error code, store the error-corrected write data and store the write error code, and in the read operation, correct an error of the write data on the basis of the write error code stored in the write operation, output the error-corrected write data as the read data, and output the write error code stored in the write operation, as the read error code.

In an embodiment, an error correction method may include: during a write operation according to a logic level combination of a command, generating a write error code including information on an error included in write data, and outputting the write data and the write error code to a semiconductor device; and during a read operation according to a logic level combination of the command, receiving read data and a read error code from the semiconductor device, and correcting an error included in the read data, on the basis of the read error code.

In an embodiment, a semiconductor system may include: a controller including an external error correction circuit, the external error correction circuit configured for outputting, in a write operation, first and second data and first and second error codes through first and second input/output lines; and a semiconductor device including an internal error correction circuit and first and second memory devices, the internal error correction circuit, in the write operation, configured for receiving the first data and the first error code through the first input/output line, correcting an error included in the first data to be stored in the first memory device, on the basis of the first error code, receiving the second data and the second error code through the second input/output line, and correcting an error included in the second data to be stored in the second memory device, on the basis of the second error code.

In an embodiment, an error correction method may include: during a write operation according to a logic level combination of a command, generating a first error code including information on an error included in first data, generating a second error code including information on an error included in the first data and second data, and outputting the first and second data and the first and second error codes to a semiconductor device; and during a read operation according to a logic level combination of the command, receiving third and fourth error codes and third and fourth data from the semiconductor device, and correcting an error included in the third and fourth data, on the basis of the fourth error code.

DETAILED DESCRIPTION

Figure 1:
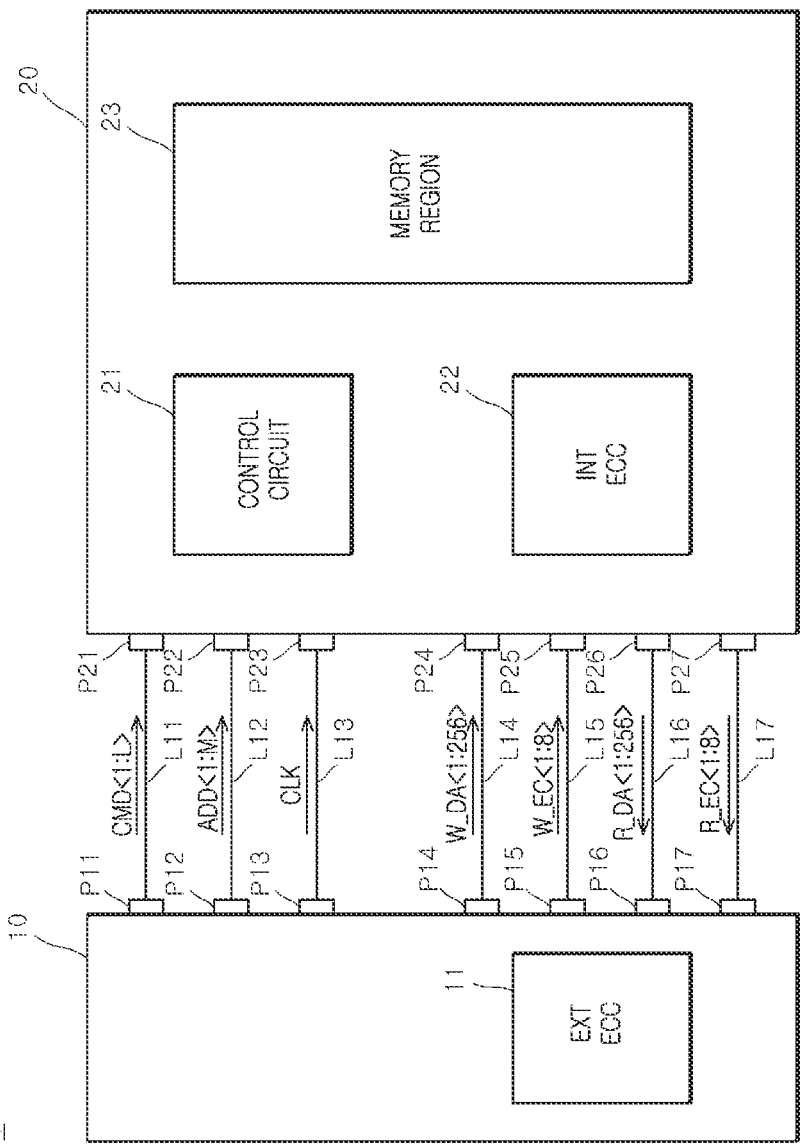
FIG. 1 is a block diagram illustrating a configuration of a semiconductor system in accordance with an embodiment of the present disclosure.

The term "preset" means that the numerical value of a parameter is predetermined when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through still another component interposed therebetween. On the other hand, when one component is referred to as being "directly coupled" or "directly connected" to another component, it should be understood that the components are directly coupled or connected to each other without still another component interposed therebetween.

"Logic high level" and "logic low level" are used to describe the logic levels of signals. A signal having "logic high level" is distinguished from a signal having "logic low level." For example, when a signal having a first voltage corresponds to a "logic high level," a signal having a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described through embodiments. The scope of the present disclosure is not limited by the embodiments.

Some embodiments of the present disclosure are directed to a semiconductor system in which in a write operation, a controller outputs data and error codes to a semiconductor device through input/output lines and in a read operation, the controller detects a failure of the input/output lines depending on whether an error included in data is corrected on the basis of error codes input from the semiconductor device through the input/output lines.

By the semiconductor system according to the embodiments of the present disclosure, in a write operation, a controller may output data and error codes to a semiconductor device through input/output lines, and in a read operation, the controller may detect a failure of the input/output lines depending on whether an error included in data is corrected on the basis of error codes input from the semiconductor device through the input/output lines.

Also, by the semiconductor system according to the embodiments of the present disclosure, each of the controller and the semiconductor device may correct an error included in data, by using error codes generated in the controller, whereby it is possible to secure the reliability of data.

Further, by the error correction method according to the embodiments of the present disclosure, in a write operation, a controller may output data and error codes to a semiconductor device through input/output lines, and in a read operation, the controller may detect a failure of the input/output lines depending on whether an error included in data is corrected on the basis of error codes input from the semiconductor device through the input/output lines.

In addition, by the error correction method according to the embodiments of the present disclosure, each of the controller and the semiconductor device may correct an error included in data, by using error codes generated in the controller, whereby it is possible to secure the reliability of data.

As illustrated in FIG. 1, a semiconductor system 1 in accordance with an embodiment of the present disclosure may include a controller 10 and a semiconductor device 20.

The controller 10 may include a first control pin P11, a second control pin P12, a third control pin P13, a fourth control pin P14, a fifth control pin P15, a sixth control pin P16 and a seventh control pin P17. The semiconductor device 20 may include a first semiconductor pin P21, a second semiconductor pin P22, a third semiconductor pin P23, a fourth semiconductor pin P24, a fifth semiconductor pin P25, a sixth semiconductor pin P26 and a seventh semiconductor pin P27. A first input/output line L11 may be coupled between the first control pin P11 and the first semiconductor pin P21. A second input/output line L12 may be coupled between the second control pin P12 and the second semiconductor pin P22. A third input/output line L13 may be coupled between the third control pin P13 and the third semiconductor pin P23. A fourth input/output line L14 may be coupled between the fourth control pin P14 and the fourth semiconductor pin P24. A fifth input/output line L15 may be coupled between the fifth control pin P15 and the fifth semiconductor pin P25. A sixth input/output line L16 may be coupled between the sixth control pin P16 and the sixth semiconductor pin P26. A seventh input/output line L17 may be coupled between the seventh control pin P17 and the seventh semiconductor pin P27.

The controller 10 may transmit first to Lth commands CMD<1:L> for performing a write operation and a read operation to the semiconductor device 20 through the first input/output line 11. The controller 10 may transmit first to Mth addresses ADD<1:M> for performing the write operation and the read operation to the semiconductor device 20 through the second input/output line L12. The controller 10 may transmit a clock CLK to the semiconductor device 20 through the third input/output line L13. In the write operation, the controller 10 may transmit first to 256th write data W_DA<1:256> to the semiconductor device 20 through the fourth input/output line L14. In the write operation, the controller 10 may transmit first to eighth write error codes W_EC<1:8> to the semiconductor device 20 through the fifth input/output line L15. In the read operation, the semiconductor device 20 may transmit first to 256th read data R_DA<1:256> to the controller 10 through the sixth input/output line L16. In the read operation, the semiconductor device 20 may transmit first to eighth read error codes R_EC<1:8> to the controller 10 through the seventh input/output line L17. The number "L" of bits of the first to Lth commands CMD<1:L> may be set to a natural number, and may be set as various numbers of bits depending on an embodiment. Logic level combinations of the first to Lth commands CMD<1:L> for performing the write operation and the read operation may be set as different logic level combinations, respectively. The number "M" of bits of the first to Mth addresses ADD<1:M> may be set to a natural number, and may be set as various numbers of bits depending on an embodiment. Logic level combinations of the first to Mth addresses ADD<1:M> for performing the write operation and the read operation may be set as various logic level combinations. The numbers of bits of the first to 256th write data W_DA<1:256> and the first to 256th read data R_DA<1:256> may be set to the same number of bits, and may be set as various numbers of bits depending on an embodiment. The numbers of bits of the first to eighth write error codes W_EC<1:8> and the first to eighth read error codes R_EC<1:8> may be set to the same number of bits, and may be set as various numbers of bits depending on an embodiment.

The controller 10 may include an external error correction circuit 11.

In the write operation, the external error correction circuit 11 may output the first to 256th write data W_DA<1:256>. In the write operation, the external error correction circuit 11 may output the first to eighth write error codes W_EC<1:8> including information on an error included in the first to 256th write data W_DA<1:256>. In the read operation, the external error correction circuit 11 may receive the first to 256th read data R_DA<1:256> and the first to eighth read error codes R_EC<1:8>. In the read operation, the external error correction circuit 11 may correct an error included in the first to 256th read data R_DA<1:256>, on the basis of the first to eighth read error codes R_EC<1:8>. In the read operation, the external error correction circuit 11 may correct an error included in the first to 256th read data R_DA<1:256>, by performing an ECC decoding operation on the first to 256th read data R_DA<1:256> and the first to eighth read error codes R_EC<1:8>.

When the external error correction circuit 11 corrects, in the read operation, an error included in the first to 256th read data R_DA<1:256>, the controller 10 may detect that a failure has occurred in the fourth input/output line L14 and the sixth input/output line L16. When the external error correction circuit 11 corrects, in the read operation, no error included in the first to 256th read data R_DA<1:256>, the controller 10 may detect that no failure has occurred in the fourth input/output line L14 and the sixth input/output line L16.

The semiconductor device 20 may include a control circuit 21, an internal error correction circuit 22 and a memory region 23.

The control circuit 21 may control the write operation and the read operation of the semiconductor device 20 according to logic level combinations of the first to Lth commands CMD<1:L> and the first to Mth addresses ADD<1:M> in synchronization with the clock CLK.

In the write operation, the internal error correction circuit 22 may correct an error included in the first to 256th write data W_DA<1:256>, on the basis of the first to eighth write error codes W_EC<1:8>. In the read operation, the internal error correction circuit 22 may output the error-corrected first to 256th read data R_DA<1:256> and the first to eighth read error codes R_EC<1:8>.

In the write operation, the memory region 23 may receive, from the internal error correction circuit 22, and store the error-corrected first to 256th write data W_DA<1:256> and the first to eighth write error codes W_EC<1:8>. In the read operation, the memory region 23 may output, to the internal error correction circuit 22, the first to 256th write data W_DA<1:256> and the first to eighth write error codes W_EC<1:8> stored in the write operation.

Figure 2:
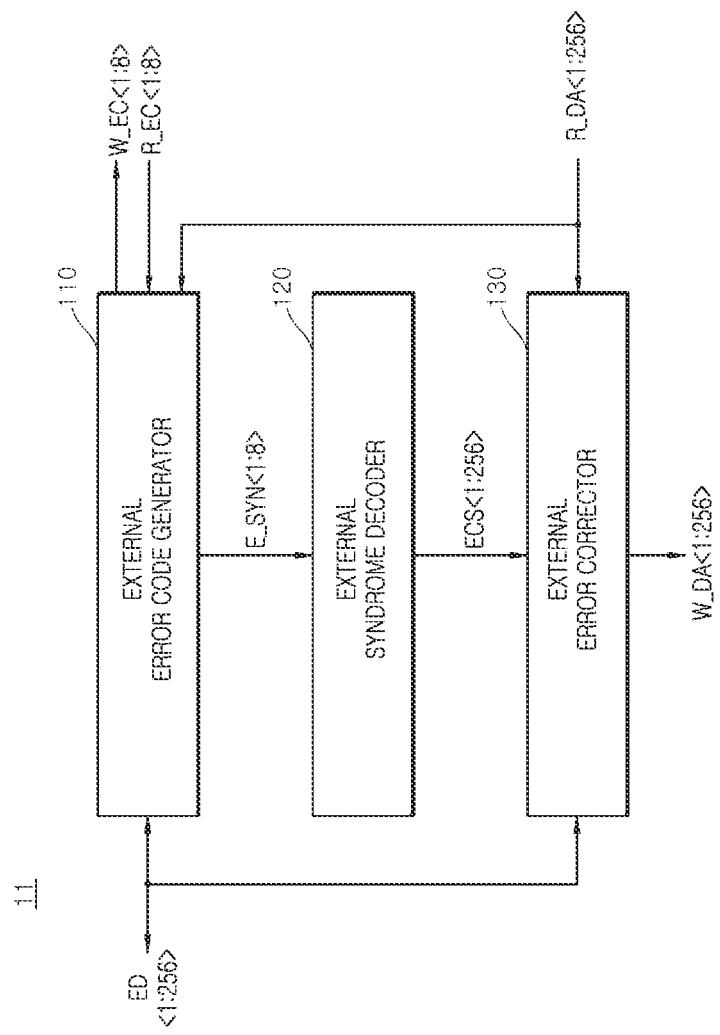
FIG. 2 is a block diagram illustrating a configuration of an external error correction circuit included in a controller illustrated in FIG. 1.

FIG. 2 is a block diagram illustrating a configuration of an embodiment of the external error correction circuit 11. As illustrated in FIG. 2, the external error correction circuit 11 may include an external error code generator 110, an external syndrome decoder 120 and an external error corrector 130.

In the write operation, the external error code generator 110 may generate the first to eighth write error codes W_EC<1:8> including error information on first to 256th external data ED<1:256>. In the write operation, the external error code generator 110 may generate the first to eighth write error codes W_EC<1:8> by performing an ECC encoding operation on the first to 256th external data ED<1:256> input from an external device (e.g., a host). The first to eighth write error codes W_EC<1:8> may be output to the semiconductor device 20. In the read operation, the external error code generator 110 may generate first to eighth external syndromes E_SYN<1:8> from the first to 256th read data R_DA<1:256> and the first to eighth read error codes R_EC<1:8>. In the read operation, the external error code generator 110 may generate the first to eighth external syndromes E_SYN<1:8> by comparing a result of ECC encoding the first to 256th read data R_DA<1:256> with the first to eighth read error codes R_EC<1:8>.

In the read operation, the external syndrome decoder 120 may generate first to 256th external error correction signals ECS<1:256> by performing an ECC decoding operation on the first to eighth external syndromes E_SYN<1:8>. In the read operation, the external syndrome decoder 120 may generate the first to 256th external error correction signals ECS<1:256> including location information of an error included in the first to 256th read data R_DA<1:256>, by performing an ECC decoding operation on the first to eighth external syndromes E_SYN<1:8>.

In the write operation, the external error corrector 130 may output the first to 256th external data ED<1:256> as the first to 256th write data W_DA<1:256>. The first to 256th write data W_DA<1:256> may be output to the semiconductor device 20. In the read operation, the external error corrector 130 may correct an error included in the first to 256th read data R_DA<1:256>, on the basis of the first to 256th external error correction signals ECS<1:256>. In the read operation, the external error corrector 130 may correct an error of the first to 256th read data R_DA<1:256> by inverting a bit of the first to 256th read data R_DA<1:256> corresponding to a bit enabled among the first to 256th external error correction signals ECS<1:256>. For example, when the first external error correction signal ECS<1> is enabled, the external error corrector 130 may correct an error by inverting the first read data R_DA<1>. In the read operation, the external error corrector 130 may output the error-corrected first to 256th read data R_DA<1:256> as the first to 256th external data ED<1:256>. The external error corrector 130 may output the first to 256th external data ED<1:256> to the external device (e.g., a host).

The ECC encoding operation includes an operation of generating parities by comparing data including a plurality of bits in a general error correction circuit (ECC). The ECC decoding operation includes an operation of generating syndromes by comparing parities previously generated in the general error correction circuit and parities generated by comparing data including a plurality of bits, identifying a location of an error of the data by using the generated syndromes and correcting the error that has a location that is identified. An ECC encoding operation and an ECC decoding operation, which will be described below, mean the same operation with the exception that only input and output signals are different.

Figure 3:
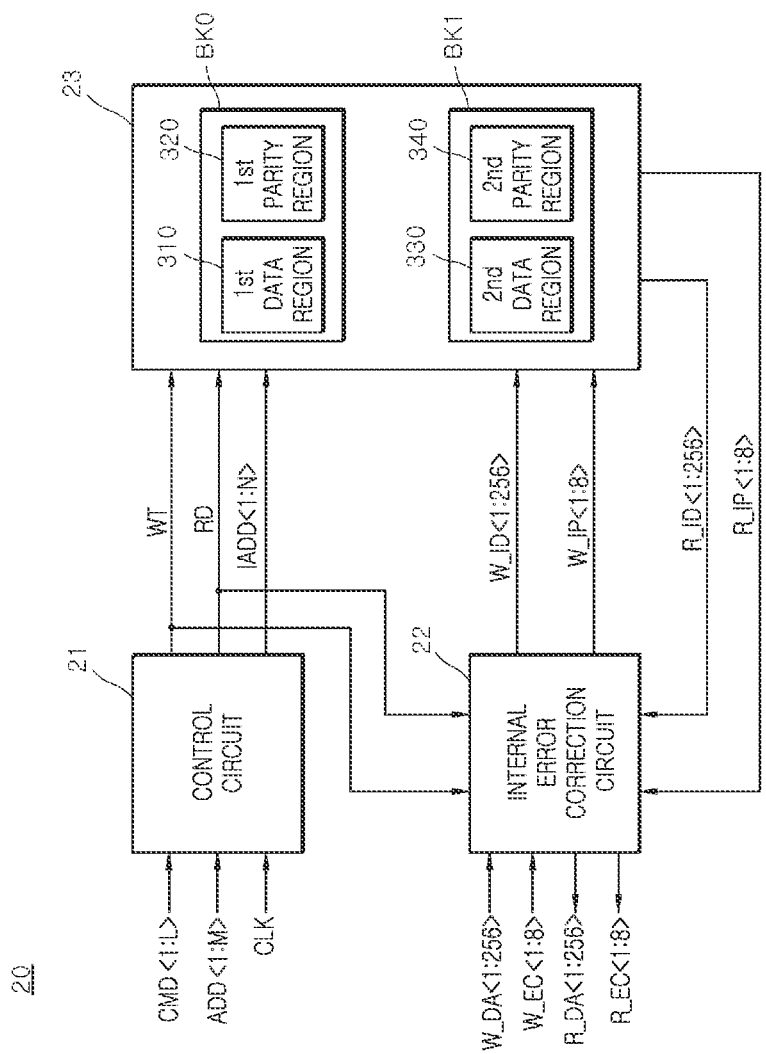
FIG. 3 is a block diagram illustrating a configuration of a semiconductor device included in the semiconductor system illustrated in FIG. 1.

FIG. 3 is a block diagram illustrating a configuration of an embodiment of the semiconductor device 20. As illustrated in FIG. 3, the semiconductor device 20 may include the control circuit 21, the internal error correction circuit 22 and the memory region 23.

The control circuit 21 may generate a write signal WT and a read signal RD depending on a logic level combination of the first to Lth commands CMD<1:L> in synchronization with the clock CLK. The control circuit 21 may generate the write signal WT in synchronization with the clock CLK when a logic level combination of the first to Lth commands CMD<1:L> is a logic level combination for performing the write operation. The control circuit 21 may generate the read signal RD in synchronization with the clock CLK when a logic level combination of the first to Lth commands CMD<1:L> is a logic level combination for performing the read operation. The control circuit 21 may generate first to Nth internal addresses IADD<1:N> according to a logic level combination of the first to Mth addresses ADD<1:M> in synchronization with the clock CLK. The control circuit 21 may generate the first to Nth internal addresses IADD<1:N> by decoding the first to Mth addresses ADD<1:M> in synchronization with the clock CLK. The number "N" of the bits of the first to Nth internal addresses IADD<1:N> may be set as a natural number, and may be set to various numbers of bits depending on an embodiment.

When the write signal WT is input, the internal error correction circuit 22 may correct an error included in the first to 256th write data W_DA<1:256>, on the basis of the first to eighth write error codes W_EC<1:8>. When the write signal WT is input, the internal error correction circuit 22 may generate first to 256th internal write data W_ID<1:256> from the error-corrected first to 256th write data W_DA<1:256>. When the write signal WT is input, the internal error correction circuit 22 may generate first to eighth internal write parities W_IP<1:8> from the first to eighth write error codes W_EC<1:8>. When the write signal WT is input, the internal error correction circuit 22 may output the first to eighth write error codes W_EC<1:8> as the first to eighth internal write parities W_IP<1:8>.

When the read signal RD is input, the internal error correction circuit 22 may correct an error included in first to 256th internal read data R_ID<1:256>, on the basis of first to eighth internal read parities R_IP<1:8>. When the read signal RD is input, the internal error correction circuit 22 may generate the first to 256th read data R_DA<1:256> from the error-corrected first to 256th internal read data R_ID<1:256>. When the read signal RD is input, the internal error correction circuit 22 may generate the first to eighth read error codes R_EC<1:8> from the first to eighth internal read parities R_IP<1:8>. When the read signal RD is input, the internal error correction circuit 22 may output the first to eighth internal read parities R_IP<1:8> as the first to eighth read error codes R_EC<1:8>.

The memory region 23 may include a first bank BK0 and a second bank BK1. The first bank BK0 may include a first data region 310 and a first parity region 320. The second bank BK1 may include a second data region 330 and a second parity region 340.

When the write signal WT is input, the first data region 310 of the first bank BK0 may store the first to 256th internal write data W_ID<1:256> at a location selected by the first to Nth internal addresses IADD<1:N>. When the write signal WT is input, the first parity region 320 of the first bank BK0 may store the first to eighth internal write parities W_IP<1:8> at a location selected by the first to Nth internal addresses IADD<1:N>.

When the read signal RD is input, the first data region 310 of the first bank BK0 may output the first to 256th internal write data W_ID<1:256> stored at the location selected by the first to Nth internal addresses IADD<1:N>, as the first to 256th internal read data R_ID<1:256>. When the read signal RD is input, the first parity region 320 of the first bank BK0 may output the first to eighth internal write parities W_IP<1:8> stored at the location selected by the first to Nth internal addresses IADD<1:N>, as the first to eighth internal read parities R_IP<1:8>.

When the write signal WT is input, the second data region 330 of the second bank BK1 may store the first to 256th internal write data W_ID<1:256> at a location selected by the first to Nth internal addresses IADD<1:N>. When the write signal WT is input, the second parity region 340 of the second bank BK1 may store the first to eighth internal write parities W_IP<1:8> at a location selected by the first to Nth internal addresses IADD<1:N>.

When the read signal RD is input, the second data region 330 of the second bank BK1 may output the first to 256th internal write data W_ID<1:256> stored at the location selected by the first to Nth internal addresses IADD<1:N>, as the first to 256th internal read data R_ID<1:256>. When the read signal RD is input, the second parity region 340 of the second bank BK1 may output the first to eighth internal write parities W_IP<1:8> stored at the location selected by the first to Nth internal addresses IADD<1:N>, as the first to eighth internal read parities R_IP<1:8>.

Although the memory region 23 illustrated in FIG. 3 is implemented to include the first bank BK0 and the second bank BK1, it is to be noted that the memory region 23 may be implemented to include various numbers of banks depending on an embodiment.

Figure 4:
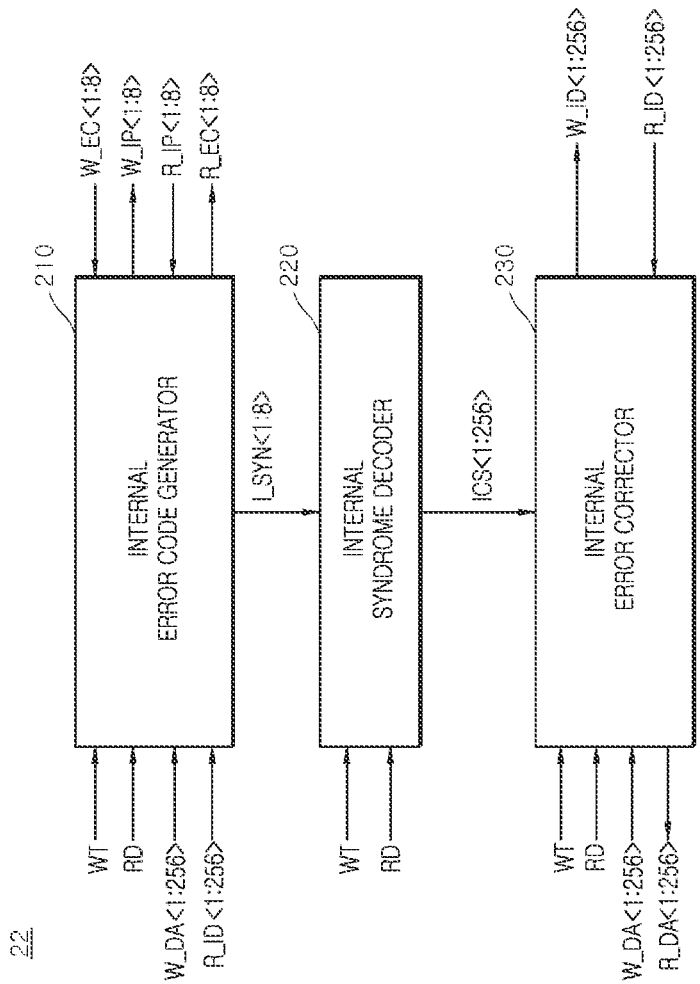
FIG. 4 is a block diagram illustrating a configuration of an internal error correction circuit included in the semiconductor device illustrated in FIG. 3.

FIG. 4 is a block diagram illustrating a configuration of an embodiment of the internal error correction circuit 22. As illustrated in FIG. 4, the internal error correction circuit 22 may include an internal error code generator 210, an internal syndrome decoder 220 and an internal error corrector 230.

When the write signal WT is input, the internal error code generator 210 may generate first to eighth internal syndromes I_SYN<1:8> from the first to 256th write data W_DA<1:256> and the first to eighth write error codes W_EC<1:8>. When the write signal WT is input, the internal error code generator 210 may generate the first to eighth internal syndromes I_SYN<1:8> by comparing a result of ECC encoding the first to 256th write data W_DA<1:256> with the first to eighth write error codes W_EC<1:8>. When the write signal WT is input, the internal error code generator 210 may generate the first to eighth internal write parities W_IP<1:8> from the first to eighth write error codes W_EC<1:8>. When the write signal WT is input, the internal error code generator 210 may output the first to eighth write error codes W_EC<1:8> as the first to eighth internal write parities W_IP<1:8>.

When the read signal RD is input, the internal error code generator 210 may generate the first to eighth internal syndromes I_SYN<1:8> from the first to 256th internal read data R_ID<1:256> and the first to eighth internal read parities R_IP<1:8>. When the read signal RD is input, the internal error code generator 210 may generate the first to eighth internal syndromes I_SYN<1:8> by comparing a result of ECC encoding the first to 256th internal read data R_ID<1:256> with the first to eighth internal read parities R_IP<1:8>. When the read signal RD is input, the internal error code generator 210 may generate the first to eighth read error codes R_EC<1:8> from the first to eighth internal read parities R_IP<1:8>. When the read signal RD is input, the internal error code generator 210 may output the first to eighth internal read parities R_IP<1:8> as the first to eighth read error codes R_EC<1:8>.

When the write signal WT is input, the internal syndrome decoder 220 may generate first to 256th internal error correction signals ICS<1:256> including location information of an error included in first to 256th write data W_DA<1:256>, by performing an ECC decoding operation on the first to eighth internal syndromes I_SYN<1:8>.

When the read signal RD is input, the internal syndrome decoder 220 may generate the first to 256th internal error correction signals ICS<1:256> including location information of an error included in the first to 256th internal read data R_ID<1:256>, by performing an ECC decoding operation on the first to eighth internal syndromes I_SYN<1:8>.

When the write signal WT is input, the internal error corrector 230 may correct an error included in the first to 256th write data W_DA<1:256>, on the basis of the first to 256th internal error correction signals ICS<1:256>. When the write signal WT is input, the internal error corrector 230 may correct an error of the first to 256th write data W_DA by inverting a bit of the first to 256th write data W_DA<1:256> corresponding to a bit enabled among the first to 256th internal error correction signals ICS<1:256>. For example, when the first internal error correction signal ICS<1> is enabled, the internal error corrector 230 may correct an error by inverting the first write data W_DA<1>. When the write signal WT is input, the internal error corrector 230 may output the error-corrected first to 256th write data W_DA<1:256> as the first to 256th internal write data W_ID<1:256>.

When the read signal RD is input, the internal error corrector 230 may correct an error included in the first to 256th internal read data R_ID<1:256>, on the basis of the first to 256th internal error correction signals ICS<1:256>. When the read signal RD is input, the internal error corrector 230 may correct an error of the first to 256th internal read data R_ID<1:256> by inverting a bit of the first to 256th internal read data R_ID<1:256> corresponding to a bit enabled among the first to 256th internal error correction signals ICS<1:256>. For example, when the first internal error correction signal ICS<1> is enabled, the internal error corrector 230 may correct an error by inverting the first internal read data R_ID<1>. When the read signal RD is input, the internal error corrector 230 may output the error-corrected first to 256th internal read data R_ID<1:256> as the first to 256th read data R_DA<1:256>.

Figure 5:
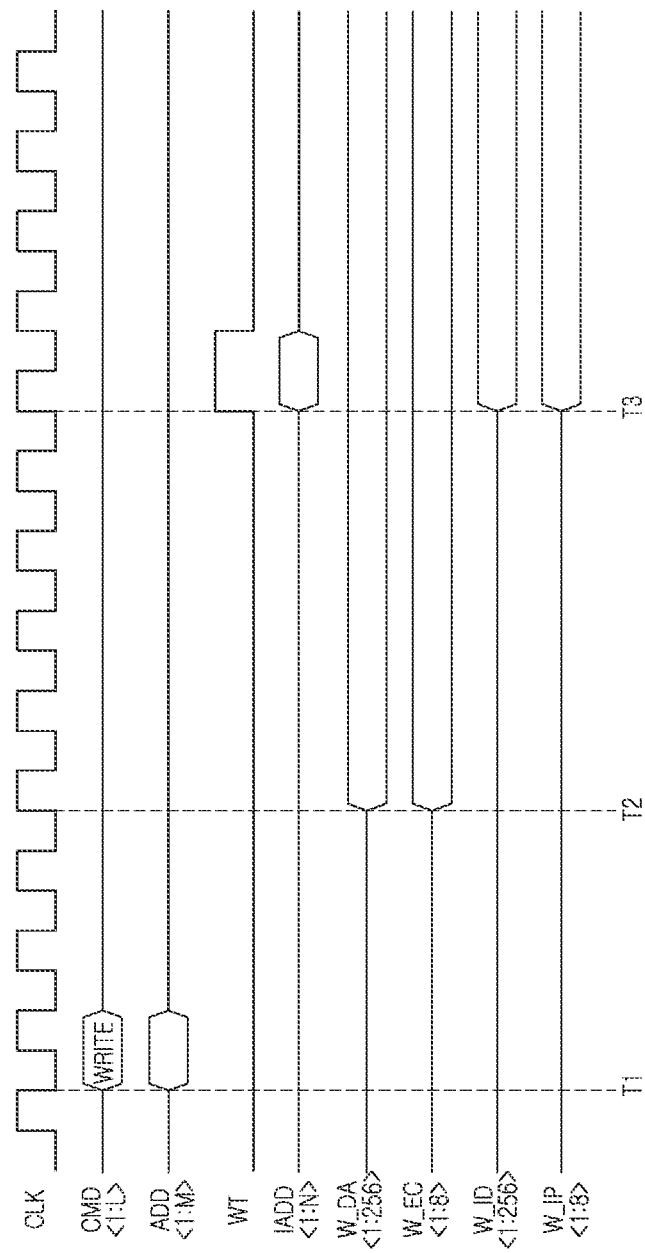
FIGS. 5 and 6 are timing diagrams to assist in the explanation of operations of the semiconductor system illustrated in FIG. 1.
Figure 6:
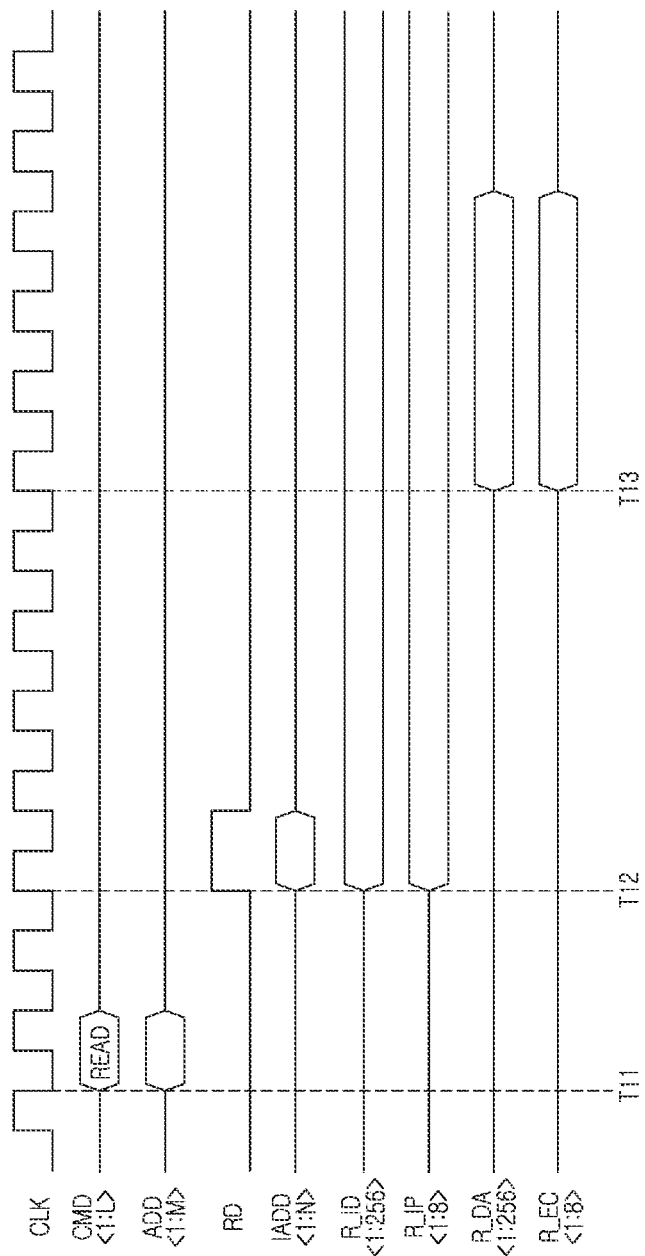

An error correction operation of the semiconductor system 1 in accordance with the embodiment of the present disclosure will be described below with reference to FIGS. 5 and 6, by taking, as an example, an operation in which a write operation and a read operation for the first bank BK0 are sequentially performed to detect a failure of an input/output line.

First, the write operation of the error correction operation will be described below with reference to FIG. 5.

At a time point T1, the controller 10 transmits the first to Lth commands CMD<1:L> for performing a write operation WRITE to the semiconductor device 20 through the first input/output line 11. The controller 10 transmits the first to Mth addresses ADD<1:M> for performing the write operation to the semiconductor device 20 through the second input/output line L12. The controller 10 transmits the clock CLK to the semiconductor device 20 through the third input/output line L13.

At a time point T2, the external error correction circuit 11 of the controller 10 transmits, in the write operation, the first to 256th write data W_DA<1:256> to the semiconductor device 20 through the fourth input/output line L14. In the write operation, the external error correction circuit 11 transmits the first to eighth write error codes W_EC<1:8> including information on an error included in the first to 256th write data W_DA<1:256>, to the semiconductor device 20 through the fifth input/output line L15.

At a time point T3, the control circuit 21 of the semiconductor device 20 generates the write signal WT of a logic high level according to a logic level combination of the first to Lth commands CMD<1:L> for performing the write operation WRITE, in synchronization with the clock CLK. The control circuit 21 generates the first to Nth internal addresses IADD<1:N> according to a logic level combination of the first to Mth addresses ADD<1:M> in synchronization with the clock CLK.

The internal error correction circuit 22 receives the write signal WT of a logic high level and corrects an error included in the first to 256th write data W_DA<1:256>, by performing an ECC encoding operation and an ECC decoding operation on the basis of the first to 256th write data W_DA<1:256> and the first to eighth write error codes W_EC<1:8>. The internal error correction circuit 22 receives the write signal WT of a logic high level and generates the first to 256th internal write data W_ID<1:256> from the error-corrected first to 256th write data W_DA<1:256>. The internal error correction circuit 22 receives the write signal WT of a logic high level and generates the first to eighth internal write parities W_IP<1:8> from the first to eighth write error codes W_EC<1:8>.

The first data region 310 of the first bank BK0 receives the write signal WT of a logic high level and stores the first to 256th internal write data W_ID<1:256> at a location selected by the first to Nth internal addresses IADD<1:N>.

The first parity region 320 of the first bank BK0 receives the write signal WT of a logic high level and stores the first to eighth internal write parities W_IP<1:8> at a location selected by the first to Nth internal addresses IADD<1:N>.

Next, the read operation of the error correction operation will be described below with reference to FIG. 6.

At a time point T11, the controller 10 transmits the first to Lth commands CMD<1:L> for performing a read operation READ to the semiconductor device 20 through the first input/output line 11. The controller 10 transmits the first to Mth addresses ADD<1:M> for performing the read operation to the semiconductor device 20 through the second input/output line L12. The controller transmits the clock CLK to the semiconductor device 20 through the third input/output line L13.

At a time point T12, the control circuit 21 of the semiconductor device 20 generates the read signal RD of a logic high level according to a logic level combination of the first to Lth commands CMD<1:L> for performing the read operation READ, in synchronization with the clock CLK. The control circuit 21 generates the first to Nth internal addresses IADD<1:N> according to a logic level combination of the first to Mth addresses ADD<1:M> in synchronization with the clock CLK.

The first data region 310 of the first bank BK0 receives the read signal RD of a logic high level and outputs the first to 256th internal write data W_ID<1:256> stored at a location selected by the first to Nth internal addresses IADD<1:N>, as the first to 256th internal read data R_ID<1:256>.

The first parity region 320 of the first bank BK0 receives the read signal RD of a logic high level and outputs the first to eighth internal write parities W_IP<1:8> stored at a location selected by the first to Nth internal addresses IADD<1:N>, as the first to eighth internal read parities R_IP<1:8>.

At a time point T13, by the read signal RD of a logic high level generated at the time point T12, the internal error correction circuit 22 corrects an error included in the first to 256th internal read data R_ID<1:256>, by performing an ECC encoding operation and an ECC decoding operation on the basis of the first to 256th internal read data R_ID<1:256> and the first to eighth internal read parities R_IP<1:8>. The internal error correction circuit 22 generates the first to 256th read data R_DA<1:256> from the error-corrected first to 256th internal read data R_ID<1:256>. The internal error correction circuit 22 generates the first to eighth read error codes R_EC<1:8> from the first to eighth internal read parities R_IP<1:8>. The first to 256th read data R_DA<1:256> are transmitted to the controller 10 through the sixth input/output line L16. The first to eighth read error codes R_EC<1:8> are transmitted to the controller through the seventh input/output line L17.

In the read operation, the external error correction circuit 11 corrects an error included in the first to 256th read data R_DA<1:256>, by performing an ECC decoding operation on the basis of the first to 256th read data R_DA<1:256> and the first to eighth read error codes R_EC<1:8>.

When the external error correction circuit 11 corrects an error included in the first to 256th read data R_DA<1:256>, the controller 10 may detect that a failure has occurred in the fourth input/output line L14 and the sixth input/output line L16. When the external error correction circuit 11 corrects, in the read operation, no error included in the first to 256th read data R_DA<1:256>, the controller 10 may detect that no failure has occurred in the fourth input/output line L14 and the sixth input/output line L16.

In the semiconductor system 1 in accordance with the embodiment of the present disclosure, in a write operation, the controller 10 may output data and error codes to the semiconductor device 20 through input/output lines, and in a read operation, the controller 10 may detect a failure of input/output lines depending on whether an error included in data is corrected on the basis of error codes input from the semiconductor device 20 through input/output lines. Also, in the semiconductor system 1 in accordance with the embodiment of the present disclosure, each of the controller 10 and the semiconductor device 20 may correct an error included in data, by using error codes generated in the controller 10, whereby it may be possible to secure the reliability of data.

Figure 7:
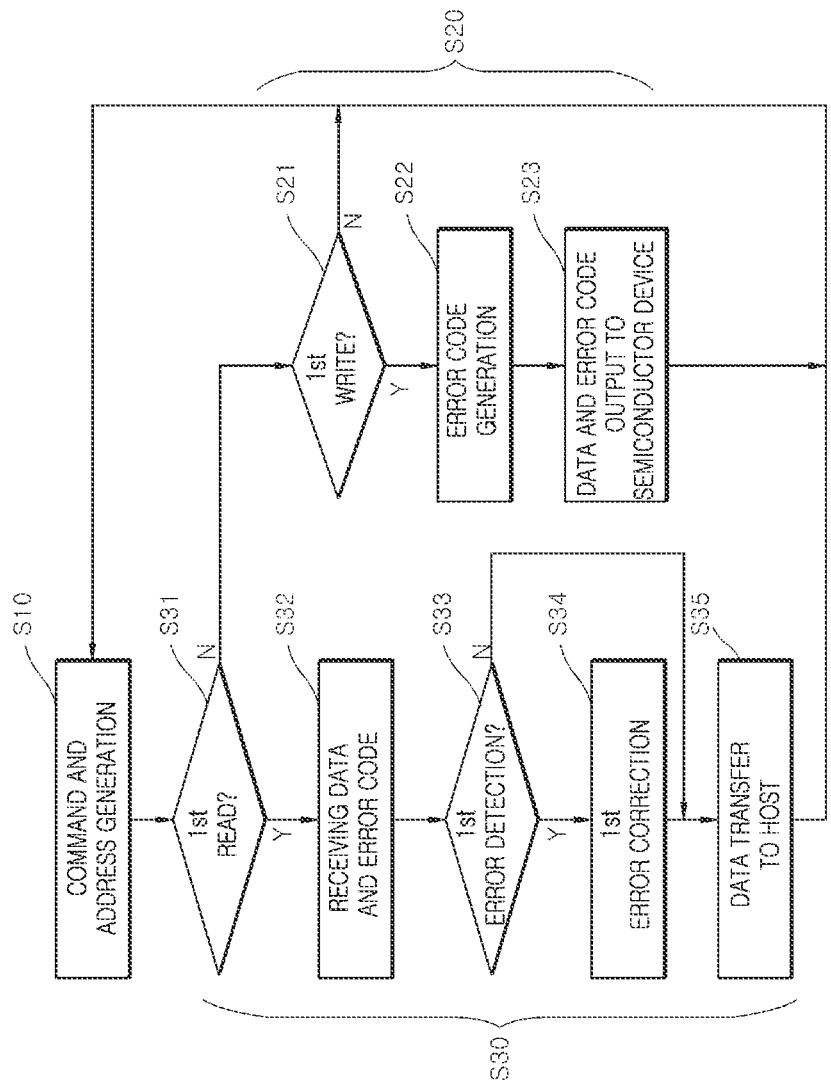
FIGS. 7 and 8 are flowcharts to assist in the explanation of an error correction method in accordance with an embodiment of the present disclosure.
Figure 8:
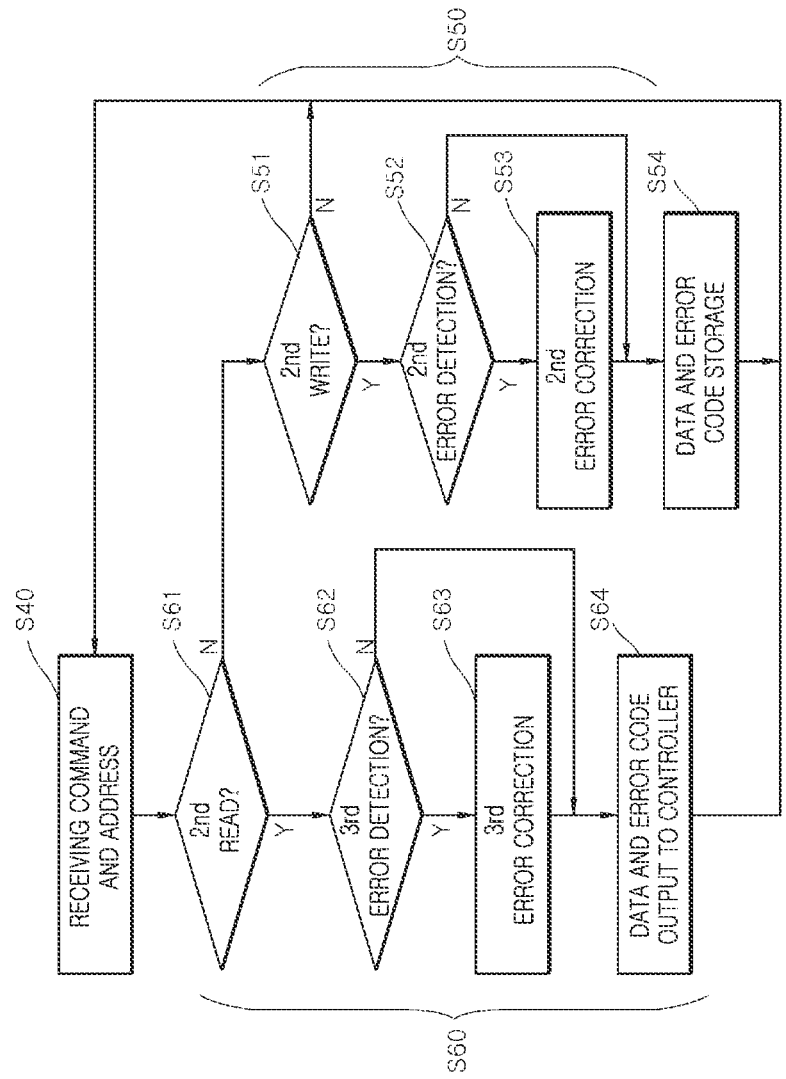

FIGS. 7 and 8 are flowcharts to assist in the explanation of an error correction method in accordance with an embodiment of the present disclosure. The error correction method in accordance with the embodiment of the present disclosure will be described below with reference to FIGS. 7 and 8.

The error correction method may include command address generation step S10, first write step S20, first read step S30, command address reception step S40, second write step S50 and second read step S60.

The command address generation step S10 may be set as step in which the controller 10 generates the first to Lth commands CMD<1:L> for performing a write operation and a read operation and the first to Mth addresses ADD<1:M>.

The first write step S20 may include first write detection step S21, error code generation step S22 and data and error code output step S23.

The first write detection step S21 may be set as step of determining whether a logic level combination of the first to Lth commands CMD<1:L> is a logic level combination for performing a write operation. When, at the first write detection step S21, the logic level combination of the first to Lth commands CMD<1:L> is a logic level combination for performing a write operation (Y), the process may enter the error code generation step S22. When, at the first write detection step S21, the logic level combination of the first to Lth commands CMD<1:L> is not a logic level combination for performing a write operation (N), the process may enter the command address generation step S10.

The error code generation step S22 may be set as step of generating, in the write operation, the first to eighth write error codes W_EC<1:8> including information on an error included in the first to 256th write data W_DA<1:256>. At the error code generation step S22, the external error correction circuit 11 may generate the first to 256th write data W_DA<1:256> from the first to 256th external data ED<1:256>. At the error code generation step S22, the external error correction circuit 11 may generate the first to eighth write error codes W_EC<1:8> including information on an error included in the first to 256th external data ED<1:256>. The first to eighth write error codes W_EC<1:8> may include error information of the first to 256th external data ED<1:256> and the first to 256th write data W_DA<1:256>.

The data and error code output step S23 may be set as step of outputting the first to 256th write data W_DA<1:256> and the first to eighth write error codes W_EC<1:8> to the semiconductor device 20. At the data and error code output step S23, the external error correction circuit 11 may output the first to 256th write data W_DA<1:256> and the first to eighth write error codes W_EC<1:8> to the semiconductor device 20.

In the write operation according to the logic level combination of the first to Lth commands CMD<1:L>, the first write step S20 may generate the first to eighth write error codes W_EC<1:8> including information on an error included in the first to 256th write data W_DA<1:256>. In the write operation according to the logic level combination of the first to Lth commands CMD<1:L>, the first write step S20 may output the first to 256th write data W_DA<1:256> and the first to eighth write error codes W_EC<1:8> to the semiconductor device 20.

The first read step S30 may include first read detection step S31, data and error code reception step S32, first error detection step S33, first error correction step S34 and data transfer step S35.

The first read detection step S31 may be set as step of determining whether a logic level combination of the first to Lth commands CMD<1:L> is a logic level combination for performing a read operation. When, at the first read detection step S31, the logic level combination of the first to Lth commands CMD<1:L> is a logic level combination for performing a read operation (Y), the process may enter the data and error code reception step S32. When, at the first read detection step S31, the logic level combination of the first to Lth commands CMD<1:L> is not a logic level combination for performing a read operation (N), the process may enter the first write detection step S21.

The data and error code reception step S32 may be set as step of receiving, in the read operation, the first to 256th read data R_DA<1:256> and the first to eighth read error codes R_EC<1:8> from the semiconductor device 20.

The first error detection step S33 may be set as step of detecting whether an error has occurred in the first to 256th read data R_DA<1:256>, on the basis of the first to eighth read error codes R_EC<1:8>. At the first error detection step S33, the external error correction circuit 11 may detect whether an error has occurred in the first to 256th read data R_DA<1:256>, by performing an ECC encoding operation on the first to 256th read data R_DA<1:256> and the first to eighth read error codes R_EC<1:8>. At the first error detection step S33, when an error has occurred in the first to 256th read data R_DA<1:256> (Y), the process may enter the first error correction step S34. At the first error detection step S33, when an error has not occurred in the first to 256th read data R_DA<1:256> (N), the process may enter the data transfer step S35.

The first error correction step S34 may be set as step of correcting an error included in the first to 256th read data R_DA<1:256>, on the basis of the first to eighth read error codes R_EC<1:8>. At the first error correction step S34, the external error correction circuit 11 may correct an error included in the first to 256th read data R_DA<1:256>, by performing an ECC decoding operation on the first to 256th read data R_DA<1:256> and the first to eighth read error codes R_EC<1:8>. At the first error correction step S34, when correcting an error included in the first to 256th read data R_DA<1:256>, the controller 10 may detect that a failure has occurred in the fourth input/output line L14 and the sixth input/output line L16. At the first error correction step S34, when correcting no error included in the first to 256th read data R_DA<1:256>, the controller 10 may detect that a failure has not occurred in the fourth input/output line L14 and the sixth input/output line L16.

The data transfer step S35 may be set as step of outputting the first to 256th read data R_DA<1:256> to the host. At the data transfer step S35, the external error correction circuit 11 may generate the first to 256th external data ED<1:256> from the error-corrected first to 256th read data R_DA<1:256> and output the first to 256th external data ED<1:256> to the host.

In the read operation according to the logic level combination of the first to Lth commands CMD<1:L>, the first read step S30 may receive the first to 256th read data R_DA<1:256> and the first to eighth read error codes R_EC<1:8> from the semiconductor device 20. In the read operation according to the logic level combination of the first to Lth commands CMD<1:L>, the first read step S30 may correct an error included in the first to 256th read data R_DA<1:256>, on the basis of the first to eighth read error codes R_EC<1:8>. The first read step S30 may generate the first to 256th external data ED<1:256> from the error-corrected first to 256th read data R_DA<1:256> and output the first to 256th external data ED<1:256> to the host.

The command address generation step S10, the first write step S20 and the first read step S30 may be performed by the controller 10 for controlling the semiconductor device 20.

The command address reception step S40 may be set as step of receiving the first to Lth commands CMD<1:L> for performing a write operation and a read operation and the first to Mth addresses ADD<1:M> from the controller 10.

The second write step S50 may include second write detection step S51, second error detection step S52, second error correction step S53 and data and error code storage step S54.

The second write detection step S51 may be set as step in which the control circuit 21 determines whether a logic level combination of the first to Lth commands CMD<1:L> is a logic level combination for performing a write operation. At the second write detection step S51, the control circuit 21 may generate the write signal WT of a logic high level when the logic level combination of the first to Lth commands CMD<1:L> is a logic level combination for performing a write operation. At the second write detection step S51, the control circuit 21 may generate the first to Nth internal addresses IADD<1:N> from the first to Mth addresses ADD<1:M>. When, at the second write detection step S51, the logic level combination of the first to Lth commands CMD<1:L> is a logic level combination for performing a write operation (Y), the process may enter the second error detection step S52. When, at the second write detection step S51, the logic level combination of the first to Lth commands CMD<1:L> is not a logic level combination for performing a write operation (N), the process may enter the command address reception step S40.

The second error detection step S52 may be set as step of detecting whether an error has occurred in the first to 256th write data W_DA<1:256>, on the basis of the first to eighth write error codes W_EC<1:8>. At the second error detection step S52, the internal error correction circuit 22 may detect whether an error has occurred in the first to 256th write data W_DA<1:256>, by performing an ECC encoding operation on the first to 256th write data W_DA<1:256> and the first to eighth write error codes W_EC<1:8>. At the second error detection step S52, when an error has occurred in the first to 256th write data W_DA<1:256> (Y), the process may enter the second error correction step S53. At the second error detection step S52, when an error has not occurred in the first to 256th write data W_DA<1:256> (N), the process may enter the data and error code storage step S54.

The second error correction step S53 may be set as step of correcting an error included in the first to 256th write data W_DA<1:256>, on the basis of the first to eighth write error codes W_EC<1:8>. At the second error correction step S53, the internal error correction circuit 22 may correct an error included in the first to 256th write data W_DA<1:256>, by performing an ECC decoding operation on the first to 256th write data W_DA<1:256> and the first to eighth write error codes W_EC<1:8>. At the second error correction step S53, the internal error correction circuit 22 may generate the first to 256th internal write data W_ID<1:256> from the error-corrected first to 256th write data W_DA<1:256>. At the second error correction step S53, the internal error correction circuit 22 may generate the first to eighth internal write parities W_IP<1:8> from the first to eighth write error codes W_EC<1:8>.

The data and error code storage step S54 may be set as step of storing the first to 256th internal write data W_ID<1:256> and the first to eighth internal write parities W_IP<1:8>. At the data and error code storage step S54, the memory region 23 may store the first to 256th internal write data W_ID<1:256> and first to eighth internal write parities W_IP<1:8> by the write signal WT of a logic high level and the first to Nth internal addresses IADD<1:N>.

In the write operation according to the logic level combination of the first to Lth commands CMD<1:L>, the second write step S50 may receive the first to 256th write data W_DA<1:256> and the first to eighth write error codes W_EC<1:8> from the controller 10. The second write step S50 may store the first to 256th internal write data W_ID<1:256> generated by correcting an error included in the first to 256th write data W_DA<1:256>, on the basis of the first to eighth write error codes W_EC<1:8>. The second write step S50 may store the first to eighth internal write parities W_IP<1:8> generated from the first to eighth write error codes W_EC<1:8>.

The second read step S60 may include second read detection step S61, third error detection step S62, third error correction step S63 and data and error code output step S64.

The second read detection step S61 may be set as step in which the control circuit 21 determines whether a logic level combination of the first to Lth commands CMD<1:L> is a logic level combination for performing a read operation. At the second read detection step S61, the control circuit 21 may generate the read signal RD of a logic high level when the logic level combination of the first to Lth commands CMD<1:L> is a logic level combination for performing a read operation. At the second read detection step S61, the control circuit 21 may generate the first to Nth internal addresses IADD<1:N> from the first to Mth addresses ADD<1:M>. At the second read detection step S61, the memory region 23 may output the first to 256th internal write data W_ID<1:256> stored therein, as the first to 256th internal read data R_ID<1:256>, by the read signal RD of a logic high level and the first to Nth internal addresses IADD<1:N>. At the second read detection step S61, the memory region 23 may output the first to eighth internal write parities W_IP<1:8> stored therein, as the first to eighth internal read parities R_IP<1:8>, by the read signal RD of a logic high level and the first to Nth internal addresses IADD<1:N>. When, at the second read detection step S61, the logic level combination of the first to Lth commands CMD<1:L> is a logic level combination for performing a read operation (Y), the process may enter the third error detection step S62. When, at the second read detection step S61, the logic level combination of the first to Lth commands CMD<1:L> is not a logic level combination for performing a read operation (N), the process may enter the second write detection step S51.

The third error detection step S62 may be set as step of detecting whether an error has occurred in the first to 256th internal read data R_ID<1:256>, on the basis of the first to eighth internal read parities R_IP<1:8>. At the third error detection step S62, the internal error correction circuit 22 may detect whether an error has occurred in the first to 256th internal read data R_ID<1:256>, by performing an ECC encoding operation on the first to 256th internal read data R_ID<1:256> and the first to eighth internal read parities R_IP<1:8>. At the third error detection step S62, when an error has occurred in the first to 256th internal read data R_ID<1:256> (Y), the process may enter the third error correction step S63. At the third error detection step S62, when an error has not occurred in the first to 256th internal read data R_ID<1:256> (N), the process may enter the data and error code output step S64.

The third error correction step S63 may be set as step of correcting an error included in the first to 256th internal read data R_ID<1:256>, on the basis of the first to eighth internal read parities R_IP<1:8>. At the third error correction step S63, the internal error correction circuit 22 may correct an error included in the first to 256th internal read data R_ID<1: 256>, by performing an ECC decoding operation on the first to 256th internal read data R_ID<1:256> and the first to eighth internal read parities R_IP<1:8>. At the third error correction step S63, the internal error correction circuit 22 may generate the first to 256th read data R_DA<1:256> from the error-corrected first to 256th internal read data R_ID<1:256>. At the third error correction step S63, the internal error correction circuit 22 may generate the first to eighth read error codes R_EC<1:8> from the first to eighth internal read parities R_IP<1:8>.

The data and error code output step S64 may be set as step of outputting the first to 256th read data R_DA<1:256> and the first to eighth read error codes R_EC<1:8> to the controller 10.

In the read operation according to the logic level combination of the first to Lth commands CMD<1:L>, the second read step S60 may generate the first to 256th internal read data R_ID<1:256> from the first to 256th internal write data W_ID<1:256> stored therein. In the read operation according to the logic level combination of the first to Lth commands CMD<1:L>, the second read step S60 may generate the first to eighth internal read parities R_IP<1:8> from the first to eighth internal write parities W_IP<1:8> stored therein. In the read operation according to the logic level combination of the first to Lth commands CMD<1:L>, the second read step S60 may correct an error included in the first to 256th internal read data R_ID<1:256>, on the basis of the first to eighth internal read parities R_IP<1:8>. The second read step S60 may output the error-corrected first to 256th internal read data R_ID<1:256> as the first to 256th read data R_DA<1:256>. The second read step S60 may output the first to eighth internal read parities R_IP<1:8> as the first to eighth read error codes R_EC<1:8>.

The command address reception step S40, the second write step S50 and the second read step S60 may be performed by the semiconductor device 20.

In the error correction method in accordance with the embodiment of the present disclosure, in a write operation, the controller 10 may output data and error codes to the semiconductor device 20 through input/output lines, and in a read operation, the controller 10 may detect a failure of the input/output lines depending on whether an error included in data is corrected on the basis of error codes input from the semiconductor device 20 through the input/output lines. Also, in the error correction method in accordance with the embodiment of the present disclosure, each of the controller 10 and the semiconductor device 20 may correct an error included in data, by using error codes generated in the controller 10, whereby it may be possible to secure the reliability of data.

Figure 9:
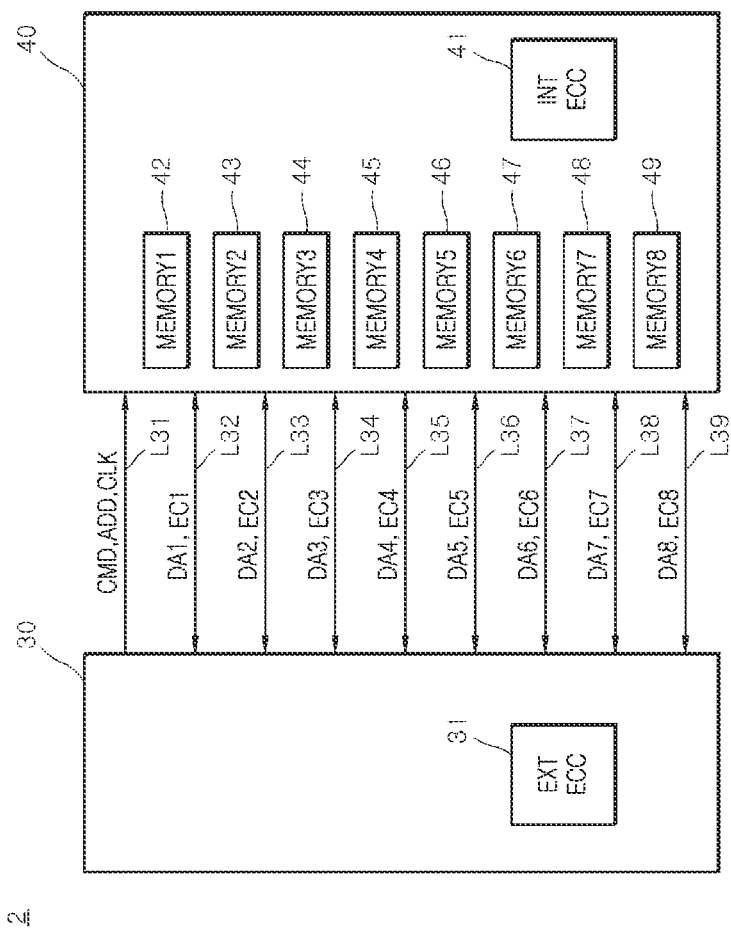
FIG. 9 is a block diagram illustrating a configuration of a semiconductor system in accordance with an embodiment of the present disclosure.

As illustrated in FIG. 9, a semiconductor system 2 in accordance with an embodiment of the present disclosure may include a controller 30 and a semiconductor device 40. The controller 30 may include an external error correction circuit 31. The semiconductor device 40 may include an internal error correction circuit 41, a first memory circuit 42, a second memory circuit 43, a third memory circuit 44, a fourth memory circuit 45, a fifth memory circuit 46, a sixth memory circuit 47, a seventh memory circuit 48 and an eighth memory circuit 49. The semiconductor system 2 in accordance with the embodiment of the present disclosure may be implemented by a dual in-line memory module (DIMM).

The controller 30 may output a command CMD, an address ADD and a clock CLK through a first input/output line L31 to control a write operation and a read operation of the semiconductor device 40.

In the write operation, the controller 30 may output first to eighth data DA1 to DA8 and then output first to eighth error codes EC1 to EC8, through second to ninth input/output lines L32 to L39. In the read operation, the controller 30 may receive the first to eighth data DA1 to DA8 and then receive the first to eighth error codes EC1 to EC8, through the second to ninth input/output lines L32 to L39. The first to eighth data DA1 to DA8 may include the first to 256th write data W_DA<1:256> and the first to 256th read data R_DA<1:256> illustrated in FIG. 1. The first to eighth error codes EC1 to EC8 may include the first to eighth write error codes W_EC<1:8> and the first to eighth read error codes R_EC<1:8> illustrated in FIG. 1.

In the write operation, the external error correction circuit 31 may output the first to eighth data DA1 to DA8. In the write operation, the external error correction circuit 31 may output the first to eighth error codes EC1 to EC8 including information on an error included in the first to eighth data DA1 to DA8. In the read operation, the external error correction circuit 31 may receive the first to eighth data DA1 to DA8 and the first to eighth error codes EC1 to EC8. In the read operation, the external error correction circuit 31 may correct an error included in the first to eighth data DA1 to DA8, on the basis of the first to eighth error codes EC1 to EC8.

The external error correction circuit 31 performs the same operation as the external error correction circuit 11 illustrated in FIG. 1 with the exception that only input and output signals are different, and thus, detailed description thereof will be omitted.

The semiconductor device 40 may receive the command CMD, the address ADD and the clock CLK through the first input/output line L31. In the write operation, the semiconductor device 40 may receive the first to eighth data DA1 to DA8 and then receive the first to eighth error codes EC1 to EC8, through the second to ninth input/output lines L32 to L39. In the read operation, the semiconductor device 40 may output the first to eighth data DA1 to DA8 and then output the first to eighth error codes EC1 to EC8, through the second to ninth input/output lines L32 to L39.

In the write operation, the internal error correction circuit 41 may correct an error included in the first to eighth data DA1 to DA8, on the basis of the first to eighth error codes EC1 to EC8. In the read operation, the internal error correction circuit 41 may output the error-corrected first to eighth data DA1 to DA8 and the first to eighth error codes EC1 to EC8.

The internal error correction circuit 41 performs the same operation as the internal error correction circuit 22 illustrated in FIG. 1 with the exception that only input and output signals are different, and thus, detailed description thereof will be omitted.

In the write operation, the first memory circuit 42 may store the first data DA1 error-corrected by the internal error correction circuit 41. In the write operation, the first memory circuit 42 may store the first error code EC1. In the read operation, the first memory circuit 42 may output the stored first data DAL. In the read operation, the first memory circuit 42 may output the stored first error code EC1.

The second to eighth memory circuits 43 to 48 perform the same operation as the first memory circuit 41 with the exception that only input and output signals are different, and thus detailed description thereof will be omitted.

Although each of the first to eighth data DA1 to DA8 illustrated in FIG. 9 is illustrated as one signal, the number of bits included in each of the first to eighth data DA1 to DA8 may be variously set depending on an embodiment. Although each of the first to eighth error codes EC1 to EC8 illustrated in FIG. 9 is illustrated as one signal, the number of bits included in each of the first to eighth error codes EC1 to EC8 may be variously set depending on an embodiment. The bits of the first to eighth data DA1 to DA8 and the first to eighth error codes EC1 to EC8 illustrated in FIG. 9 will be described below with reference to FIG. 10.

In the semiconductor system 2 in accordance with the embodiment of the present disclosure, in a write operation, the controller 30 may output data and error codes to the semiconductor device 40 through input/output lines, and in a read operation, the controller 30 may detect a failure of the input/output lines depending on whether an error included in data is corrected on the basis of error codes input from the semiconductor device 40 through the input/output lines. Also, in the semiconductor system 2 in accordance with the embodiment of the present disclosure, each of the controller 30 and the semiconductor device 40 may correct an error included in data, by using error codes generated in the controller 30, whereby it may be possible to secure the reliability of data.

Figure 10:
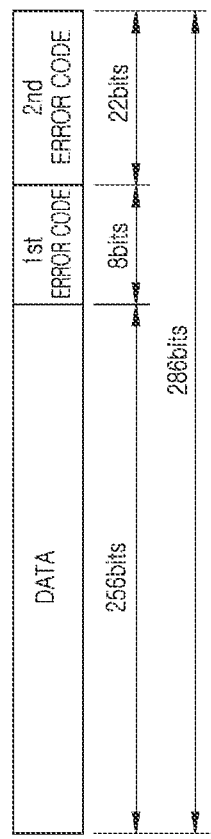
FIG. 10 is a diagram to assist in the explanation of data and error codes in accordance with the embodiment of the present disclosure.

FIG. 10 is a diagram to assist in the explanation of data and error codes used in the semiconductor system 2 in accordance with the embodiment of the present disclosure.

The total bits of data DATA, a first error code 1st ERROR CODE and a second error code 2nd ERROR CODE may be set as 286 bits.

The data DATA may be set as 256 bits among 286 bits, the first error code 1st ERROR CODE may be set as 8 bits among 286 bits, and the second error code 2nd ERROR CODE may be set as 22 bits among 286 bits. The data DATA may be set as the first to eighth data DA1 to DA8 illustrated in FIG. 8. The first error code 1st ERROR CODE may be set as any one of the first to eighth error codes EC1 to EC8. The first error code 1st ERROR CODE may be set as an error code used only in the internal error correction circuit 41 included in the semiconductor device 40. First to eighth bits (8 bits) of the second error code 2nd ERROR CODE may be set as any one of the first to eighth error codes EC1 to EC8, and ninth to eleventh bits (3 bits) of the second error code 2nd ERROR CODE may include location information of the first to eighth memory circuits 42 to 49. Twelfth to nineteenth bits (8 bits) of the second error code 2nd ERROR CODE may be set to be the same as the first to eighth bits (8 bits), and 20th to 22nd bits (3 bits) of the second error code 2nd ERROR CODE may be set to be the same as the ninth to eleventh bits (3 bits). The second error code 2nd ERROR CODE may be set as an error code which is shared and used by the external error correction circuit 31 included in the controller 30 and the internal error correction circuit 41 included in the semiconductor device 40. Bits of the data DATA, the first error code 1st ERROR CODE and the second error code 2nd ERROR CODE may be variously set depending on an embodiment.

Figure 11:
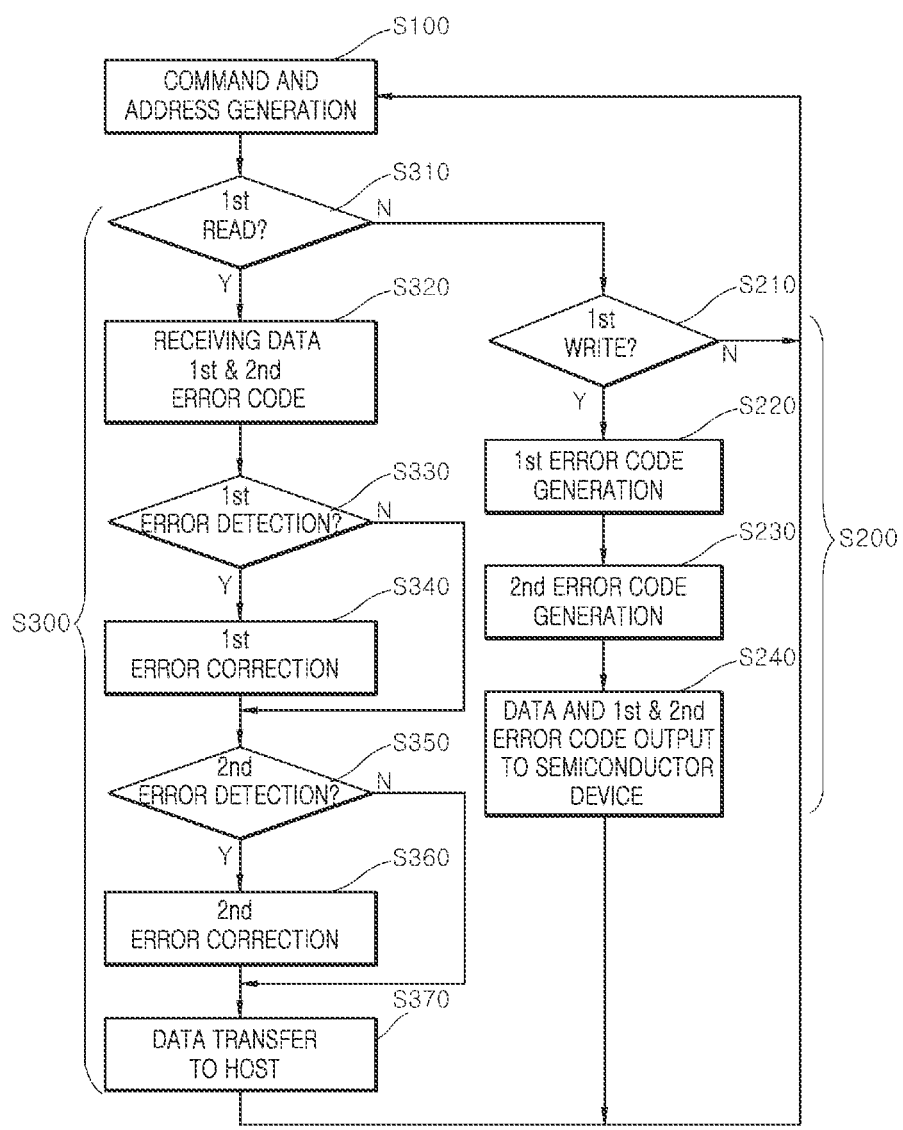
FIGS. 11 and 12 are flowcharts to assist in the explanation of an error correction method in accordance with an embodiment of the present disclosure.
Figure 12:
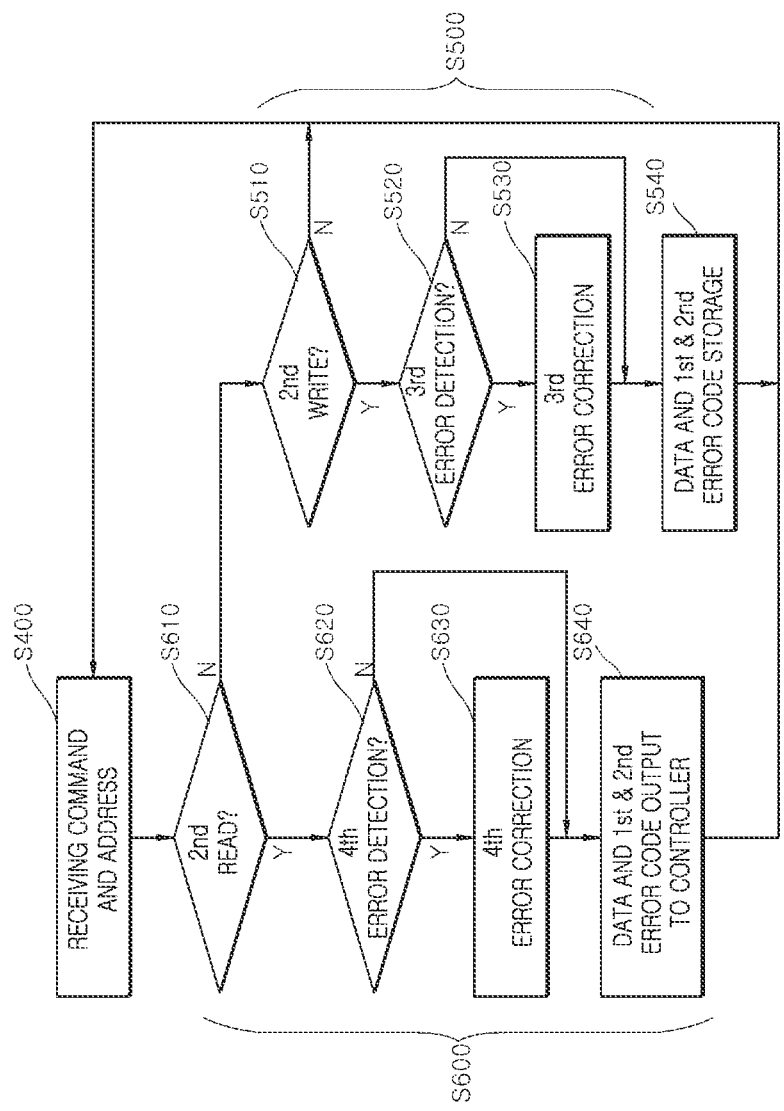

FIGS. 11 and 12 are flowcharts to assist in the explanation of an error correction method in accordance with an embodiment of the present disclosure. The error correction method in accordance with the embodiment of the present disclosure will be described below with reference to FIGS. 11 and 12.

The error correction method may include command address generation step S100, first write step S200, first read step S300, command address reception step S400, second write step S500 and second read step S600.

The command address generation step S100 may be set as step in which the controller 30 generates the command CMD for performing a write operation and a read operation and the address ADD.

The first write step S200 may include first write detection step S210, first error code generation step S220, second error code generation step S230 and data and error code output step S240.

The first write detection step S210 may be set as step of determining whether a logic level combination of the command CMD is a logic level combination for performing a write operation. When, at the first write detection step S210, the logic level combination of the command CMD is a logic level combination for performing a write operation (Y), the process may enter the first error code generation step S220. When, at the first write detection step S210, the logic level combination of the command CMD is not a logic level combination for performing a write operation (N), the process may enter the command address generation step S100.

The first error code generation step S220 may be set as step of generating, in the write operation, the first error code 1st ERROR CODE including error information on any one among the first to eighth data DA1 to DA8. At the first error code generation step S220, the external error correction circuit 31 may generate the first error code 1st ERROR CODE including error information on any one of the first to eighth data DA1 to DA8. The first error code 1st ERROR CODE may be set as an error code used in the internal error correction circuit 41 of the semiconductor device 40.

The second error code generation step S230 may be set as step of generating, in the write operation, the second error code 2nd ERROR CODE including error information on all of the first to eighth data DA1 to DA8. At the second error code generation step S230, the external error correction circuit 31 may generate the second error code 2nd ERROR CODE including error information on all of the first to eighth data DA1 to DA8. The second error code 2nd ERROR CODE may be set as an error code which is shared and used by the external error correction circuit 31 of the controller 30 and the internal error correction circuit 41 of the semiconductor device 40.

The data and error code output step S240 may be set as step of outputting the first to eighth data DA1 to DA8, the first error code 1st ERROR CODE and the second error code 2nd ERROR CODE to the semiconductor device 40. At the data and error code output step S240, the external error correction circuit 31 may output the first to eighth data DA1 to DA8, the first error code 1st ERROR CODE and the second error code 2nd ERROR CODE to the semiconductor device 40.

In the write operation according to the logic level combination of the command CMD, the first write step S200 may generate the first error code 1st ERROR CODE including error information on any one of the first to eighth data DA1 to DA8 and the second error code 2nd ERROR CODE, and may output any one of the first to eighth data DA1 to DA8, the first error code 1st ERROR CODE and the second error code 2nd ERROR CODE to the semiconductor device 20.

The first read step S300 may include first read detection step S310, data and error code reception step S320, first error detection step S330, first error correction step S340, second error detection step S350, second error correction step S360 and data transfer step S370.

The first read detection step S310 may be set as step of determining whether a logic level combination of the command CMD is a logic level combination for performing a read operation. When, at the first read detection step S310, the logic level combination of the command CMD is a logic level combination for performing a read operation (Y), the process may enter the data and error code reception step S320. When, at the first read detection step S310, the logic level combination of the command CMD is not a logic level combination for performing a read operation (N), the process may enter the first write detection step S210.

The data and error code reception step S320 may be set as step of receiving, in the read operation, the first to eighth data DA1 to DA8, the first error code 1st ERROR CODE and the second error code 2nd ERROR CODE from the semiconductor device 40.

The first error detection step S330 may be set as step of detecting whether an error has occurred in any one of the first to eighth data DA1 to DA8, on the basis of the second error code 2nd ERROR CODE. At the first error detection step S330, the external error correction circuit 31 may detect whether an error has occurred in any one of the first to eighth data DA1 to DA8, by performing an ECC encoding operation on any one of the first to eighth data DA1 to DA8 and the second error code 2nd ERROR CODE. At the first error detection step S330, when an error has occurred in any one of the first to eighth data DA1 to DA8 (Y), the process may enter the first error correction step S340. At the first error detection step S330, when an error has not occurred in any one of the first to eighth data DA1 to DA8 (N), the process may enter the second error correction step S350.

The first error correction step S340 may be set as step of correcting an error included in any one of the first to eighth data DA1 to DA8, on the basis of the second error code 2nd ERROR CODE. At the first error correction step S340, the external error correction circuit 31 may correct an error included in any one of the first to eighth data DA1 to DA8, by performing an ECC decoding operation on the second error code 2nd ERROR CODE and any one of the first to eighth data DA1 to DA8. At the first error correction step S340, when correcting an error included in any one of the first to eighth data DA1 to DA8, the controller 30 may detect that a failure has occurred in any one of the second to ninth input/output lines L32 to L39 through which any one of the first to eighth data DA1 to DA8 is input and output. For example, when correcting an error included in the first data DA1, the controller 30 may detect that a failure has occurred in the second input/output line L32. At the first error correction step S340, when correcting no error included in any one of the first to eighth data DA1 to DA8, the controller 30 may detect that a failure has not occurred in the second to ninth input/output lines L32 to L39.

The second error detection step S350 may be set as step of detecting whether an error has occurred in all the first to eighth data DA1 to DA8, on the basis of the second error code 2nd ERROR CODE. At the second error detection step S350, the external error correction circuit 31 may detect whether an error has occurred in all the first to eighth data DA1 to DA8, by performing an ECC encoding operation on all the first to eighth data DA1 to DA8 and the second error code 2nd ERROR CODE. At the second error detection step S350, when an error has occurred in all the first to eighth data DA1 to DA8 (Y), the process may enter the second error correction step S360. At the second error detection step S350, when an error has occurred in none of the first to eighth data DA1 to DA8 (N), the process may enter the data transfer step S370.

The second error correction step S360 may be set as step of correcting an error included in all the first to eighth data DA1 to DA8, on the basis of the second error code 2nd ERROR CODE. At the second error correction step S360, the external error correction circuit 31 may correct an error included in all the first to eighth data DA1 to DA8, by performing an ECC decoding operation on the second error code 2nd ERROR CODE and all the first to eighth data DA1 to DA8. At the second error correction step S360, when correcting an error included in all the first to eighth data DA1 to DA8, the controller may detect that a failure has occurred in a corresponding input/output line of all the second to ninth input/output lines L32 to L39 through which all the first to eighth data DA1 to DA8 are input and output. For example, when correcting an error included in the second data DA2, the controller 30 may detect that a failure has occurred in the third input/output line L33. At the second error correction step S360, when correcting an error included in none of the first to eighth data DA1 to DA8, the controller 30 may detect that a failure has not occurred in the second to ninth input/output lines L32 to L39.

The data transfer step S370 may be set as step of outputting the error-corrected first to eighth data DA1 to DA8 to the host. At the data transfer step S370, the external error correction circuit 31 may output the error-corrected first to eighth data DA1 to DA8 to the host.

In the read operation according to the logic level combination of the command CMD, the first read step S300 may receive the first to eighth data DA1 to DA8, the first error code 1st ERROR CODE and the second error code 2nd ERROR CODE from the semiconductor device 40. In the read operation according to the logic level combination of the command CMD, the first read step S300 may correct an error included in the first to eighth data DA1 to DA8, on the basis of the first error code 1st ERROR CODE and the second error code 2nd ERROR CODE. The first read step S300 may output the error-corrected first to eighth data DA1 to DA8 to the host.

The command address generation step S100, the first write step S200 and the first read step S300 may be performed by the controller 30 for controlling the semiconductor device 40.

The command address reception step S400 may be set as step of receiving the command CMD for performing a write operation and a read operation and the address ADD from the controller 30.

The second write step S500 may include second write detection step S510, third error detection step S520, third error correction step S530 and data and error code storage step S540.

The second write detection step S510 may be set as step of determining whether a logic level combination of the command CMD is a logic level combination for performing a write operation. When, at the second write detection step S510, the logic level combination of the command CMD is a logic level combination for performing a write operation (Y), the process may enter the third error detection step S520. When, at the second write detection step S510, the logic level combination of the command CMD is not a logic level combination for performing a write operation (N), the process may enter the command address reception step S400.

The third error detection step S520 may be set as step of detecting whether an error has occurred in any one of the first to eighth data DA1 to DA8, on the basis of the first error code 1st ERROR CODE. At the third error detection step S520, the internal error correction circuit 41 may detect whether an error has occurred in any one of the first to eighth data DA1 to DA8, by performing an ECC encoding operation on any one of the first to eighth data DA1 to DA8 and the first error code 1st ERROR CODE. At the third error detection step S520, when an error has occurred in any one of the first to eighth data DA1 to DA8 (Y), the process may enter the third error correction step S530. At the third error detection step S520, when an error has not occurred in any one of the first to eighth data DA1 to DA8 (N), the process may enter the data and error code storage step S540. According to an embodiment, the third error detection step S520 may be set as step of detecting whether an error has occurred in any one of the first to eighth data DA1 to DA8, on the basis of the second error code 2nd ERROR CODE.

The third error correction step S530 may be set as step of correcting an error included in any one of the first to eighth data DA1 to DA8, on the basis of the first error code 1st ERROR CODE. At the third error correction step S530, the internal error correction circuit 41 may correct an error included in any one of the first to eighth data DA1 to DA8, by performing an ECC decoding operation on any one of the first to eighth data DA1 to DA8 and the first error code 1st ERROR CODE. According to an embodiment, the third error correction step S530 may be set as step of correcting an error included in all the first to eighth data DA1 to DA8, on the basis of the second error code 2nd ERROR CODE.

The data and error code storage step S540 may be set as step of storing the first to eighth data DA1 to DA8, the first error code 1st ERROR CODE and the second error code 2nd ERROR CODE. At the data and error code storage step S540, a memory device selected by the address ADD among the first to eighth memory devices 42 to 49 may store any one of the first to eighth data DA1 to DA8, the first error code 1st ERROR CODE and the second error code 2nd ERROR CODE.

In the write operation according to the logic level combination of the command CMD, the second write step S500 may receive the first to eighth data DA1 to DA8, the first error code 1st ERROR CODE and the second error code 2nd ERROR CODE. The second write step S500 may correct an error included in any one of the first to eighth data DA1 to DA8, on the basis of the first error code 1st ERROR CODE, and may store the error-corrected any one of the first to eighth data DA1 to DA8. The second write step S500 may store the first error code 1st ERROR CODE and the second error code 2nd ERROR CODE.

The second read step S600 may include second read detection step S610, fourth error detection step S620, fourth error correction step S630 and data and error code output step S640.

The second read detection step S610 may be set as step of determining whether a logic level combination of the command CMD is a logic level combination for performing a read operation. At the second read detection step S610, a memory device selected by the address ADD among the first to eighth memory devices 42 to 49 may output any one of the first to eighth data DA1 to DA8, the first error code 1st ERROR CODE and the second error code 2nd ERROR CODE stored therein. When, at the second read detection step S610, the logic level combination of the command CMD is a logic level combination for performing a read operation (Y), the process may enter the fourth error detection step S620. When, at the second read detection step S610, the logic level combination of the command CMD is not a logic level combination for performing a read operation (N), the process may enter the second write detection step S510.

The fourth error detection step S620 may be set as step of detecting whether an error has occurred in any one of the first to eighth data DA1 to DA8, on the basis of the first error code 1st ERROR CODE. At the fourth error detection step S620, the internal error correction circuit 41 may detect whether an error has occurred in any one of the first to eighth data DA1 to DA8, by performing an ECC encoding operation on any one of the first to eighth data DA1 to DA8 and the first error code 1st ERROR CODE. At the fourth error detection step S620, when an error has occurred in any one of the first to eighth data DA1 to DA8 (Y), the process may enter the fourth error correction step S630. At the fourth error detection step S620, when an error has not occurred in any one of the first to eighth data DA1 to DA8 (N), the process may enter the data and error code output step S640. According to an embodiment, the fourth error detection step S620 may be set as step of detecting whether an error has occurred in any one of the first to eighth data DA1 to DA8, on the basis of the second error code 2nd ERROR CODE.

The fourth error correction step S630 may be set as step of correcting an error included in any one of the first to eighth data DA1 to DA8, on the basis of the first error code 1st ERROR CODE. At the fourth error correction step S630, the internal error correction circuit 41 may correct an error included in any one of the first to eighth data DA1 to DA8, by performing an ECC decoding operation on any one of the first to eighth data DA1 to DA8 and the first error code 1st ERROR CODE. According to an embodiment, the fourth error correction step S630 may be set as step of correcting an error included in any one of the first to eighth data DA1 to DA8, on the basis of the second error code 2nd ERROR CODE.

The data and error code output step S640 may be set as step of outputting the error-corrected any one of the first to eighth data DA1 to DA8, the first error code 1st ERROR CODE and the second error code 2nd ERROR CODE to the controller 30.

In the read operation according to the logic level combination of the command CMD, the second read step S600 may correct an error included in any one of the first to eighth data DA1 to DA8, on the basis of the stored first error code 1st ERROR CODE. The second read step S640 may output the error-corrected any one of the first to eighth data DA1 to DA8, the first error code 1st ERROR CODE and the second error code 2nd ERROR CODE.

The command address reception step S400, the second write step S500 and the second read step S600 may be performed by the semiconductor device 40.

In the error correction method in accordance with the embodiment of the present disclosure, in a write operation, the controller 30 may output data and error codes to the semiconductor device 40 through input/output lines, and in a read operation, the controller 30 may detect a failure of the input/output lines depending on whether an error included in data is corrected on the basis of error codes input from the semiconductor device 40 through the input/output lines. Also, in the error correction method in accordance with the embodiment of the present disclosure, each of the controller 30 and the semiconductor device 40 may correct an error included in data, by using error codes generated in the controller 30, whereby it may be possible to secure the reliability of data.

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. A semiconductor system comprising:
a controller configured to, in a write operation, output write data and a write error code through at least any one of a plurality of input/output lines, and in a read operation, receive read data and a read error code through at least any one of the plurality of input/output lines and detect a failure of the plurality of input/output lines depending on whether the read data is error-corrected; and
a semiconductor device configured to, in the write operation, correct an error of the write data on the basis of the write error code, store the error-corrected write data and store the write error code, and in the read operation, correct an error of the write data on the basis of the write error code stored in the write operation, output the error-corrected write data as the read data, and output the write error code stored in the write operation, as the read error code.

2. The semiconductor system according to claim 1, wherein
the controller includes an external error correction circuit, and
the external error correction circuit generates, in the write operation, the write error code including information on an error included in the write data, and corrects, in the read operation, an error of the read data on the basis of the read error code.

3. The semiconductor system according to claim 2, wherein the controller detects that a failure has occurred in the plurality of input/output lines, when the external error correction circuit corrects an error included in the read data, and
the controller detects that a failure has not occurred in the plurality of input/output lines, when the external error correction circuit does not correct an error included in the read data.

4. The semiconductor system according to claim 2, wherein the external error correction circuit comprises:
an external error code generator configured to, in the write operation, generate the write error code including information on an error included in the write data, and in the read operation, generate an external syndrome by performing an error correction code (ECC) encoding operation on the basis of the read data and the read error code;
an external syndrome decoder configured to generate an external error correction signal by performing an error correction code (ECC) decoding operation on the external syndrome; and
an external error corrector configured to, in the write operation, output the write data, and in the read operation, output external data by correcting an error included in the read data, on the basis of the external error correction signal.

5. The semiconductor system according to claim 1, wherein the controller outputs a command for performing the write operation and the read operation, an address and a clock.

6. The semiconductor system according to claim 5, wherein the semiconductor device comprises:
a control circuit configured to generate a write signal for performing the write operation and a read signal for performing the read operation, on the basis of the command in synchronization with the clock, and generate an internal address from the address;
an internal error correction circuit configured to, when the write signal is input, generate internal write data by correcting an error included in the write data, on the basis of the write error code, and generate an internal write parity from the write error code, and when the read signal is input, generate the read data by correcting an error included in internal read data, on the basis of an internal read parity, and generate the read error code from the internal read parity; and
a memory region configured to store the internal write data and the internal write parity on the basis of the write signal and the internal address, output the stored internal write data as the internal read data on the basis of the read signal and the internal address, and output the stored internal write parity as the internal read parity.

7. The semiconductor system according to claim 6, wherein the internal error correction circuit comprises:
an internal error code generator configured to, when the write signal is input, generate an internal syndrome by performing an error correction code (ECC) encoding operation on the basis of the write data and the write error code and output the write error code as the internal write parity, and when the read signal is input, generate the internal syndrome by performing the error correction code (ECC) encoding operation on the basis of the internal read data and the internal read parity and output the internal read parity as the read error code;

an internal syndrome decoder configured to generate an internal error correction signal by performing an error correction code (ECC) decoding operation on the internal syndrome; and an internal error corrector configured to, when the write signal is input, output the internal write data by correcting an error included in the write data, on the basis of the internal error correction signal, and when the read signal is input, output the read data by correcting an error included in the internal read data, on the basis of the internal error correction signal.

8. The semiconductor system according to claim 6, wherein the memory region comprises:

a data region configured to store the internal write data by the write signal and the internal address, and output the stored internal write data as the internal read data by the read signal and the internal address; and a parity region configured to store the internal write parity by the write signal and the internal address, and output the stored internal write parity as the internal read parity by the read signal and the internal address.

9. An error correction method comprising:

first write step of, in a write operation according to a logic level combination of a command, generating a write error code including information on an error included in write data, and outputting the write data and the write error code to a semiconductor device; and first read step of, in a read operation according to a logic level combination of the command, receiving read data and a read error code from the semiconductor device, and correcting an error included in the read data, on the basis of the read error code, and wherein the first write step comprises:

first write detection step of detecting whether a logic level combination of the command is a logic level combination for the write operation;

error code generation step of, in the write operation, generating the write error code including information on an error included in the write data; and data and error code output step of outputting the write data and the write error code to the semiconductor device.

10. The error correction method according to claim 9, wherein the first write step and the first read step are performed in a controller for controlling the semiconductor device.

11. The error correction method according to claim 9, wherein the first read step comprises:

first read detection step of detecting whether a logic level combination of the command is a logic level combination for the read operation;

data and error code reception step of, in the read operation, receiving the read data and the read error code;

first error detection step of detecting whether an error has occurred in the read data, on the basis of the read error code;

first error correction step of correcting an error included in the read data, when an error has occurred in the read data at the first error detection step; and data transfer step of outputting the read data to a host.

12. The error correction method according to claim 9, further comprising:

second write step of, in the write operation according to a logic level combination of the command, receiving the write data and the write error code from the controller, storing internal write data generated by correcting an error included in the write data, on the basis of the write error code, and storing an internal write parity generated from the write error code; and second read step of, the read operation according to a logic level combination of the command, outputting the read data by correcting an error included in internal read data generated from the internal write data, on the basis of an internal read parity generated from the stored internal write parity.

13. The error correction method according to claim 12, wherein the second write step and the second read step are performed in the semiconductor device.

14. The error correction method according to claim 12, wherein the second write step comprises:

second write detection step of detecting whether a logic level combination of the command is a logic level combination for the write operation;

second error detection step of, in the write operation, detecting an error included in the write data, on the basis of the write error code;

second error correction step of generating the internal write data by correcting, when an error has occurred in the write data, an error included in the write data, on the basis of the write error code, and generating the internal write parity from the write error code; and data and error code storage step of storing the internal write data and the internal write parity.

15. The error correction method according to claim 12, wherein the second read step comprises:

second read detection step of detecting whether a logic level combination of the command is a logic level combination for the read operation;

third error detection step of, in the read operation, detecting an error included in the internal read data, on the basis of the internal read parity;

third error correction step of generating the read data by correcting, when an error has occurred in the internal read data, an error included in the internal read data, on the basis of the internal read parity, and generating the read error code from the internal read parity; and data and error code output step of outputting the read data and the read error code to the controller.

16. A semiconductor system comprising:

a controller including an external error correction circuit, the external error correction circuit configured for outputting, in a write operation, first and second data and first and second error codes through first and second input/output lines; and a semiconductor device including an internal error correction circuit and first and second memory devices, the internal error correction circuit, in the write operation, configured for receiving the first data and the first error code through the first input/output line, correcting an error included in the first data to be stored in the first memory device, on the basis of the first error code, receiving the second data and the second error code through the second input/output line, and correcting an error included in the second data to be stored in the second memory device, on the basis of the second error code, and wherein in the read operation, the controller detects a failure of the first and second input/output lines depending on whether an error has occurred in the first and second data.

17. The semiconductor system according to claim 16, wherein in the write operation, the controller outputs the first and second error codes after outputting the first and second data.

18. The semiconductor system according to claim 16, wherein
in the read operation, the internal error correction circuit corrects an error included in the first data, on the basis of the first error code stored in the first memory device, and outputs the error-corrected first data to the first input/output line, and
in the read operation, the internal error correction circuit corrects an error included in the second data, on the basis of the second error code stored in the second memory device, and outputs the error-corrected second data to the second input/output line.

19. The semiconductor system according to claim 18, wherein
in the read operation, the external error correction circuit corrects an error included in the first and second data, on the basis of the first and second error codes received through the first and second input/output lines.

20. An error correction method comprising:
first write step of, in a write operation according to a logic level combination of a command, generating a first error code including information on an error included in first data, generating a second error code including information on an error included in the first data and second data, and outputting the first and second data and the first and second error codes to a semiconductor device; and
first read step of, in a read operation according to a logic level combination of the command, receiving third and fourth error codes and third and fourth data from the semiconductor device, and correcting an error included in the third and fourth data, on the basis of the fourth error code.

21. The error correction method according to claim 20, wherein the first write step and the first read step are performed in a controller for controlling the semiconductor device.

22. The error correction method according to claim 20, wherein the first write step comprises:
first write detection step of detecting whether a logic level combination of the command is a logic level combination for the write operation;
first error code generation step of, in the write operation, generating the first error code including information on an error included in the first data;
second error code generation step of, in the write operation, generating the second error code including information on an error included in the first data and the second data; and
data and error code output step of outputting the first and second data and the first and second error codes to the semiconductor device.

23. The error correction method according to claim 20, wherein the first read step comprises:
first read detection step of detecting whether a logic level combination of the command is a logic level combination for the read operation;
data and error code reception step of, in the read operation, receiving the third and fourth data and the third and fourth error codes;
first error detection step of detecting whether an error has occurred in the third data, on the basis of the third error code;
first error correction step of correcting, when an error has occurred in the third data at the first error detection step, an error included in the third data;
second error detection step of detecting whether an error has occurred in the third data and the fourth data, on the basis of the fourth error code;
second error correction step of correcting, when an error has occurred in the third data and the fourth data at the second error detection step, an error included in the third data and the fourth data; and
data transfer step of outputting the third and fourth data to a host.

24. The error correction method according to claim 20, further comprising:
second write step of, in the write operation according to a logic level combination of the command, receiving the first and second data and the first and second error codes from the controller, correcting an error included in the first and second data, on the basis of the first and second error codes, storing the error-corrected first and second data, and storing the first and second error codes; and
second read step of, in the read operation according to a logic level combination of the command, generating the third and fourth error codes from the stored first and second error codes, generating the third and fourth data from the first and second data, correcting an error included in any one of the third and fourth data, on the basis of the third error code, and outputting the third and fourth data.

25. The error correction method according to claim 24, wherein the second write step and the second read step are performed in the semiconductor device.

26. The error correction method according to claim 24, wherein the second write step comprises:
second write detection step of detecting whether a logic level combination of the command is a logic level combination for the write operation;
third error detection step of, in the write operation, detecting an error included in any one of the first and second data, on the basis of the first error code;
third error correction step of correcting, when an error has occurred in any one of the first and second data, an error included in any one of the first and second data, on the basis of the first error code; and
data and error code storage step of storing the first and second data and the first and second error codes.

27. The error correction method according to claim 24, wherein the second read step comprises:
second read detection step of detecting whether a logic level combination of the command is a logic level combination for the read operation;
fourth error detection step of, in the read operation, generating the third and fourth data from the first and second data, generating the third and fourth error codes from the first and second error codes, and detecting an error included in any one of the third and fourth data, on the basis of the third error code;
fourth error correction step of correcting, when an error has occurred in any one of the third and fourth data, an error included in any one of the third and fourth data, on the basis of the third error code; and
data and error code output step of outputting the third and fourth data and the third and fourth error codes to the controller.

* * * * *